(12) United States Patent
Yi et al.

(10) Patent No.: US 8,933,427 B2
(45) Date of Patent: Jan. 13, 2015

(54) VARIABLE RESISTANCE MEMORY DEVICE AND METHOD FOR FABRICATING THE SAME

(75) Inventors: Jae-Yun Yi, Gyeonggi-do (KR);
Seok-Pyo Song, Gyeonggi-do (KR);
Seung-Hwan Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 62 days.

(21) Appl. No.: 13/619,286

(22) Filed: Sep. 14, 2012

(65) Prior Publication Data
US 2013/0248798 A1 Sep. 26, 2013

(30) Foreign Application Priority Data
Mar. 23, 2012 (KR) .................. 10-2012-0030023

(51) Int. Cl.
*H01L 29/02* (2006.01)
(52) U.S. Cl.
USPC .............................................. 257/2; 438/382
(58) Field of Classification Search
CPC ..................................... H01L 45/14
USPC ............................................................. 257/2
See application file for complete search history.

(56) References Cited

U.S. PATENT DOCUMENTS

| | | | |
|---|---|---|---|
| 2006/0157679 A1* | 7/2006 | Scheuerlein | 257/2 |
| 2007/0161172 A1* | 7/2007 | Lin | 438/197 |
| 2010/0327249 A1* | 12/2010 | Choi et al. | 257/2 |
| 2011/0068409 A1* | 3/2011 | Kim et al. | 257/379 |
| 2011/0111568 A1* | 5/2011 | Kim et al. | 438/268 |
| 2012/0068136 A1* | 3/2012 | Park et al. | 257/1 |
| 2012/0286227 A1* | 11/2012 | Chung | 257/4 |

* cited by examiner

*Primary Examiner* — Thao X Le
*Assistant Examiner* — Laura Dykes
(74) *Attorney, Agent, or Firm* — IP & T Group LLP (57) ABSTRACT

A variable resistance memory device includes active regions defined by an isolation layer in a semiconductor substrate, trenches in the semiconductor substrate, which extend in a direction crossing the active regions, junction regions formed in the active regions on both sides of the trenches, and variable resistance patterns interposed between the word lines and the junction regions.

11 Claims, 9 Drawing Sheets

VARIABLE RESISTANCE MEMORY DEVICE AND METHOD FOR FABRICATING THE SAME

CROSS-REFERENCE TO RELATED APPLICATIONS

The present application claims priority of Korean Patent Application No. 10-2012-0030023, filed on Mar. 23, 2012, which is incorporated herein by reference in its entirety.

BACKGROUND

1. Field

Exemplary embodiments of the present invention relate to a variable resistance memory device and a method for fabricating the same, and more particularly, to a variable resistance memory device, which includes a variable resistance layer capable of electrical resistance changed by migration of vacancies or ions or phase change of a substance, and a method for fabricating the same.

2. Description of the Related Art

A variable resistance memory device refers to a device which stores data, based on such a characteristic that resistance changes according to an external stimulus and switching is implemented between two different resistance states. The variable resistance memory device includes a resistive random access memory (ReRAM), a phase change RAM (PCRAM), and a spin transfer torque-RAM (STT-RAM). The variable resistance memory device has been researched because of a simple structure and various excellent properties such as nonvolatility and so forth.

Meanwhile, in order to improve the integration degree of the variable resistance memory device, the so-called cross point cell array structure has been suggested. The cross point cell array structure refers to a structure including memory cells disposed at crossing points between a plurality of bit lines extending in a direction and a plurality of word lines extending in another direction crossing with the bit lines.

However, in order to form the cross point cell array structure, a plurality of mask processes should be repeated to pattern the bit lines and the word lines to a minimum critical dimension. Further, processes for a cell region and a peripheral region should be separately performed. Accordingly, fabrication processes may be complicated, and the fabrication costs may increase.

SUMMARY

Embodiments of the present invention are directed to a variable resistance memory device, which can decrease the number of mask processes and make entire processes easy and simple, including word lines formed in multiple layers to improve the integration degree of memory cells, and a method for fabricating the same.

In accordance with an embodiment of the present invention, a variable resistance memory device includes: active regions defined by an isolation layer in a semiconductor substrate; trenches in the semiconductor substrate, which extend in a direction crossing the active regions; junction regions formed in the active regions on both sides of the trenches; and variable resistance patterns interposed between the word lines and the junction regions.

In accordance with another embodiment of the present invention, a method for fabricating a variable resistance memory device includes: forming an isolation layer in a semiconductor substrate to define active regions; defining trenches, which extend in a direction crossing the active regions, in the semiconductor substrate; sequentially forming variable resistance patterns and word lines in the trenches; and forming junction regions in the active regions on both sides of the trenches.

A non-volatile memory device includes an isolation layer to define an active region, and plural stacked word lines, each attached with a variable resistance layer to store data, wherein the isolation layer and the plural stacked word lines are located within trenches in a substrate, and the plural stacked word lines cross the active region.

According to the embodiments of the present invention, the number of mask processes may be decreased, and thus, entire processes may be made easier and simpler. Also, as word lines are formed in multiple layers, the integration degree of memory cells may be improved.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1:
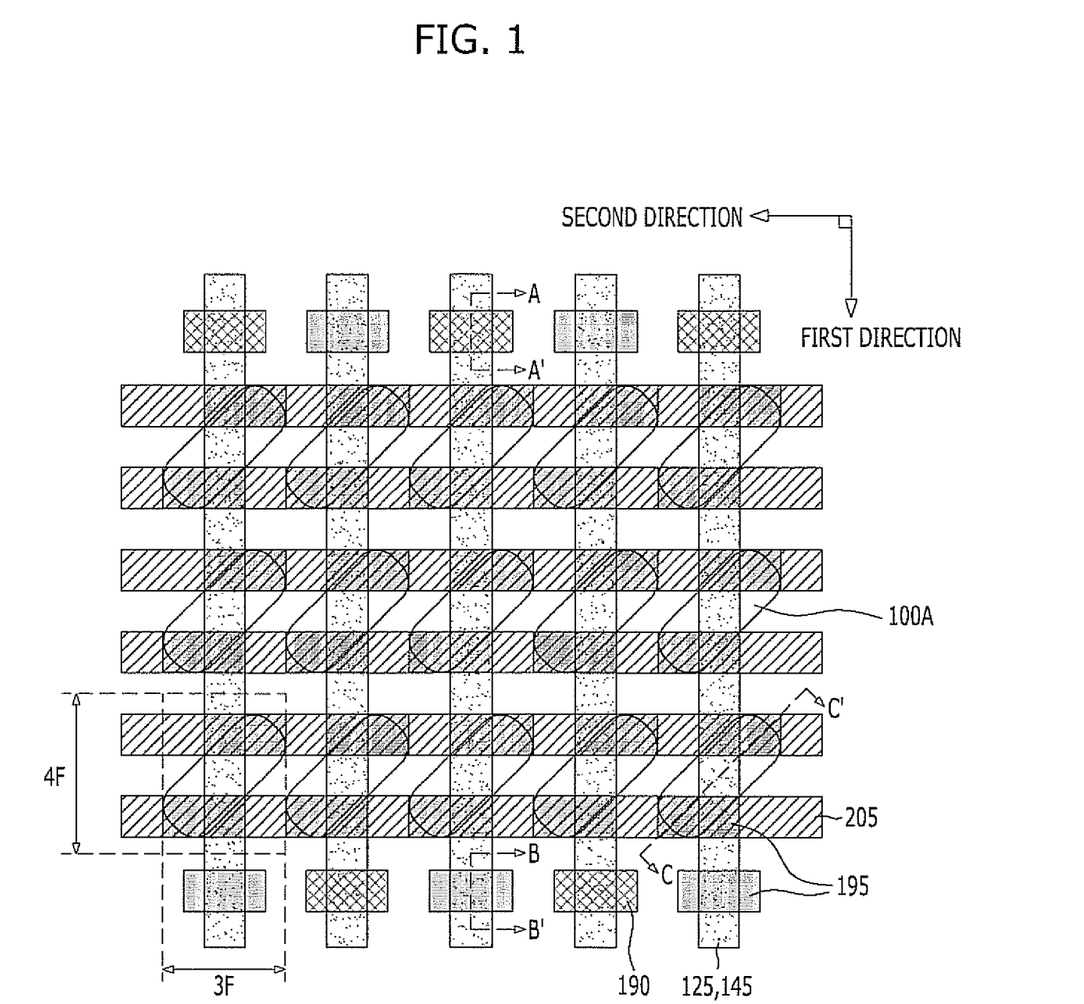
FIG. 1 is a plan view illustrating the layout of a cell region of a variable resistance memory device in accordance with an embodiment of the present invention.

FIG. 1 is a plan view illustrating the layout of a cell region of a variable resistance memory device in accordance with an embodiment of the present invention. FIGS. 2A to 2K are cross-sectional views explaining the variable resistance memory device in accordance with the embodiment of the present invention and a method for fabricating the same. In particular, FIG. 2K is a cross-sectional view illustrating the variable resistance memory device in accordance with the embodiment of the present invention. FIGS. 2A to 2J are cross-sectional views illustrating the processes of a method for fabricating the variable resistance memory device of FIG. 2K. The cell region C in each of FIGS. 2A to 2K shows the cross-section taken along the line C-C' of FIG. 1.

Figure 2A:
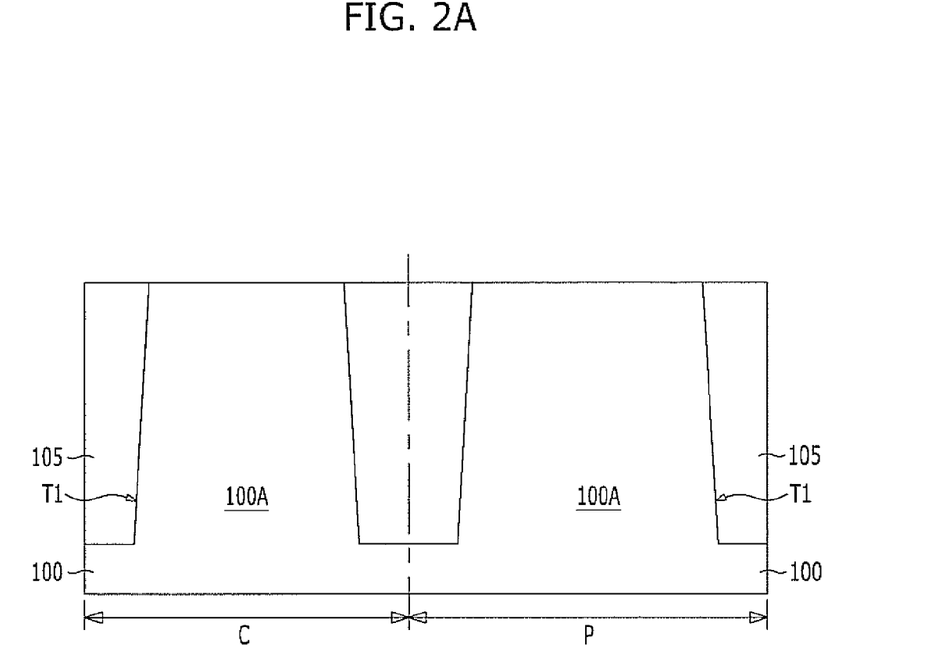
FIGS. 2A to 2K are cross-sectional views explaining the variable resistance memory device in accordance with the embodiment of the present invention and a method for fabricating the same.

Referring to FIG. 2A, after a mask pattern (not shown) is formed on a semiconductor substrate 100 having a cell region C and a peripheral circuit region P to expose areas where an isolation layer 105 is to be formed, first trenches T1 are defined by partially etching the semiconductor substrate 100 using the mask pattern as an etch mask. The semiconductor substrate 100 may be a P-type silicon substrate.

Then, the isolation layer 105 is formed by filling a dielectric substance in the trenches T1 through at least any one of SOD (spin-on-dielectric), HARP (high aspect ratio process), and HDP (high density plasma). At this time, a planarization process such as chemical mechanical polishing (CMP) may be performed.

As a result of this process, active regions 100A of an island-like shape with a major axis and a minor axis are defined. The active regions 100A may be arranged in an oblique direction against a first direction (see FIG. 1) so as to increase the integration degree.

Figure 2B:
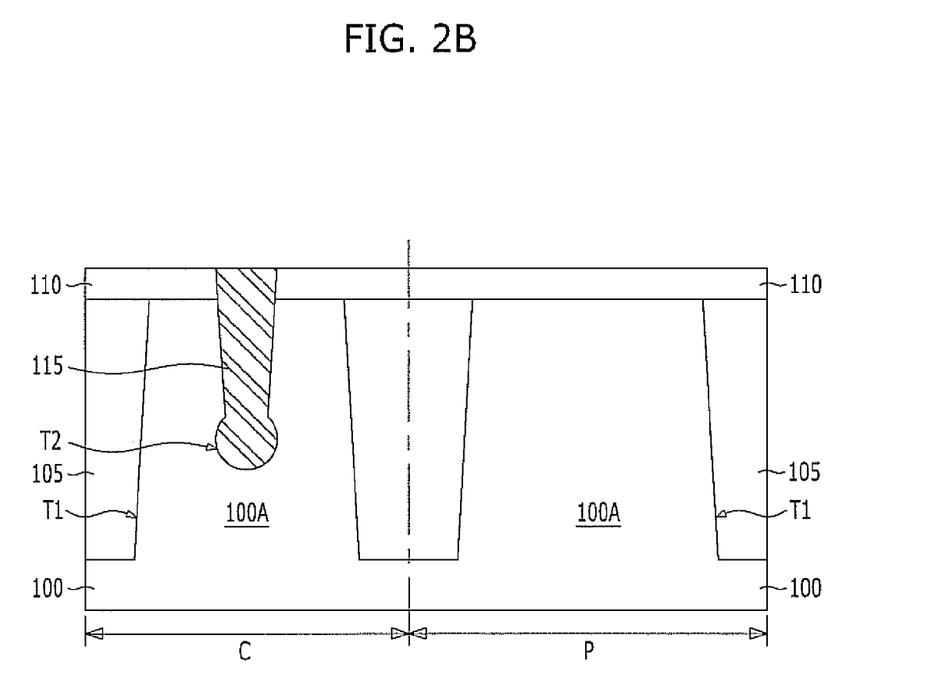

Referring to FIG. 2B, after forming a first hard mask pattern 110 on the active regions 100A and the isolation layer 105 to expose areas where first and second word lines are formed later, second trenches T2 are defined by partially etching the active regions 100A and the isolation layer 105 using the first hard mask pattern 110 as an etch mask. The second trenches T2 each having a bulb-like shape constituted by a primary trench and a secondary trench may be defined by forming primary trenches through unisotropically etching the active regions 100A and the isolation layer 105 to a predetermined depth, forming a sacrificial layer (not shown) on the sidewalls of the primary trenches and then forming spherically shaped secondary trenches at the lower ends of the primary trenches through performing an isotropic etching process.

The second trenches T2 may be defined sufficiently deep to allow word lines to be stacked by at least two layers, which may have a depth equal to or larger than 2,000 Å. In particular, as the second trenches T2 are defined into the bulb-like shape, it is possible to minimize interference between first junction regions formed later. The second trenches T2 may extend in the first direction (see FIG. 1) crossing the active regions 100A of the cell region C. A plurality of second trenches T2 may be arranged parallel to one another.

Next, after performing a radical oxidation process to prevent a phenomenon that charges are trapped to the surfaces of the second trenches T2, a first dielectric layer 115 is formed to be filled in the second trenches T2. The first dielectric layer 115 may be formed by depositing LP-TEOS (low pressure-tetra ethyl ortho silicate) on the inner walls of the second trenches T2 and then filling a dielectric substance in the second trenches T2 through SOD (spin-on-dielectric).

Figure 2C:
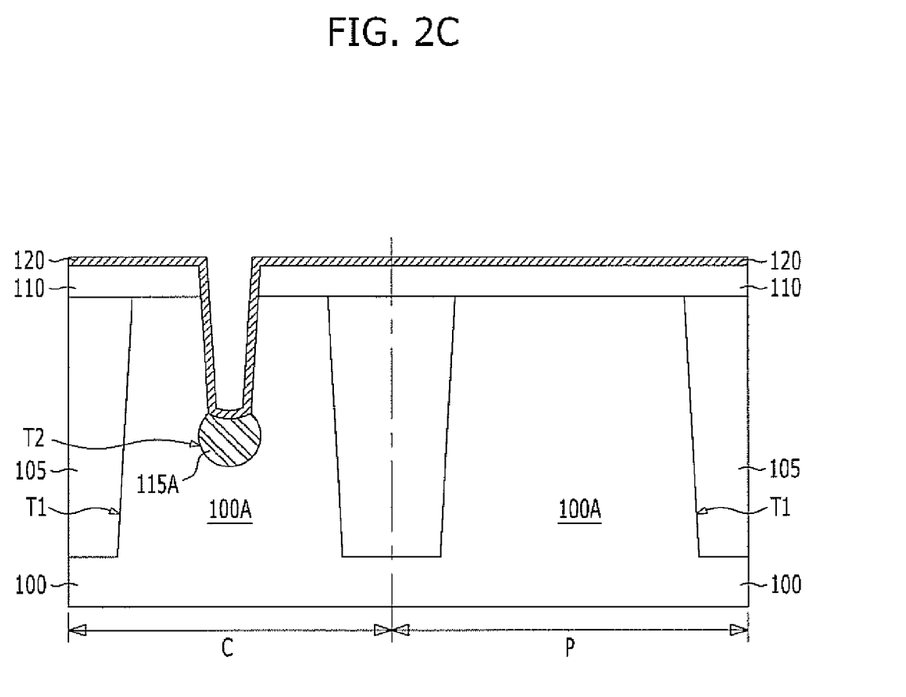

Referring to FIG. 2C, the first dielectric layer 115 is partially removed through a wet and/or dry cleaning process.

The first dielectric layer 115 remaining in the lower portions of the second trenches T2 after the process is completed will be referred to as first dielectric layer patterns 115A. Due to the presence of the first dielectric layer patterns 115A, interference between first junction regions may be prevented. The first dielectric layer patterns 115A may have a height of 100 Å to 1,000 Å.

In succession, a first variable resistance layer 120 is formed on the first hard mask pattern 110 including the second trenches T2.

The first variable resistance layer 120 may include an oxynitride layer of which resistance changes according to an applied voltage or current to be switched between at least two different resistance states. For example, the first variable resistance layer 120 may be formed by depositing a nitride layer to 3 Å to 200 Å and oxidating partially or wholly the nitride layer. By performing the oxidation process through radical oxidation, an oxynitride layer with excellent properties may be uniformly formed, and by controlling the degree of oxidation, the characteristics of the variable resistance memory device may be changed. Specifically, the remaining nitride layer may serve as a tunneling barrier which suppresses a disturbing phenomenon that occurs in an unselected memory cell in the operation of the variable resistance memory device.

However, the present invention is not limited to such, and the first variable resistance layer 120 may include other substances having electrical resistance changed by migration of oxygen vacancies or ions or phase change of substances. For example, the first variable resistance layer 120 may be formed of a binary oxide including a transition metal oxide (TMO), a perovskite-based substance, or a chalcogenide-based substance. The transition metal oxide (TMO) may include a titanium oxide ($TiO_2$ or $Ti_5O_7$), a hafnium oxide ($HfO_2$), a zirconium oxide ($ZrO_2$), an aluminum oxide ($Al_2O_3$), a tantalum oxide ($Ta_2O_5$), a niobium oxide ($Nb_2O_5$), a cobalt oxide ($Co_3O_4$), a nickel oxide (NiO), a tungsten oxide ($WO_3$), and a lanthanum oxide ($La_2O_3$). The perovskite-based substance may include PCMO ($Pr_{1-x}Ca_xMnO_3$), STO ($SrTiO_3$), and BTO ($BaTiO_3$). The chalcogenide-based substance may include GST (GeSbTe) including germanium, antimony and tellurium mixed at predetermined ratios.

Figure 2D:
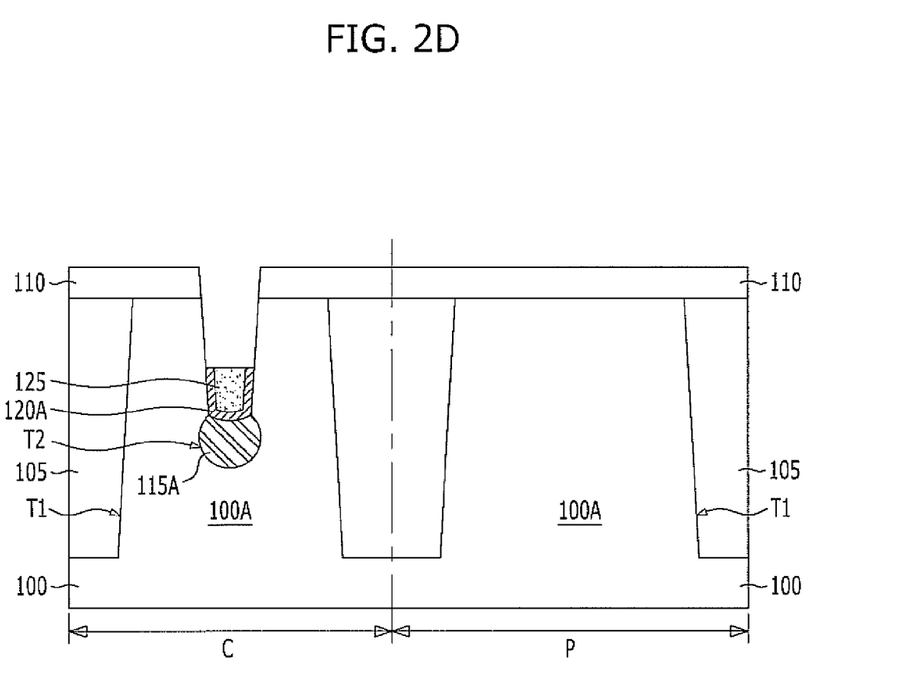

Referring to FIG. 2D, a conductive layer (not shown) for first word lines is formed on the first variable resistance layer 120. The conductive layer for first word lines may be formed by depositing a barrier metal layer such as a titanium nitride (TiN), a tantalum nitride (TaN), or a tungsten nitride (WN) to about 5 Å to 100 Å and then depositing tungsten (W) to fill the second trenches T2.

Then, after a planarization process such as chemical mechanical polishing (CMP) is performed until the upper surface of the first hard mask pattern 110 is exposed, first word lines 125 are formed by additionally etching back the first variable resistance layer 120 and the conductive layer for first word lines.

As a result of this process, the first hard mask pattern 110 may be partially removed. The remaining portions of the first variable resistance layer 120 will be referred to as first variable resistance patterns 120A. The first word lines 125 may extend in the first direction (see FIG. 1) and may have a height of 300 Å to 1,000 Å.

Figure 2E:
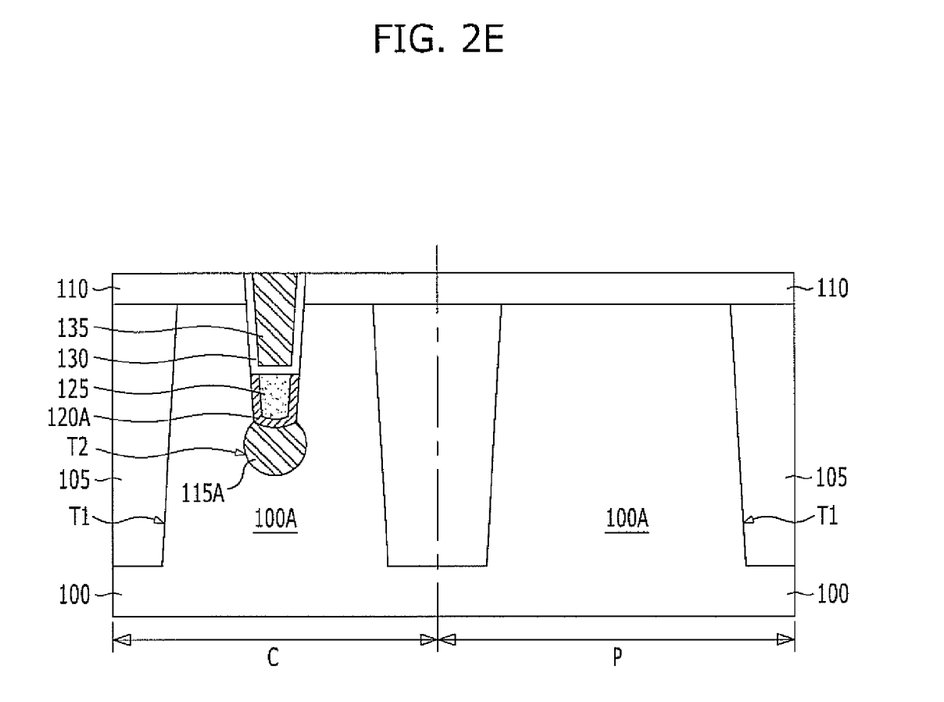

Referring to FIG. 2E, a first passivation layer 130 is formed on the inner walls of the second trenches T2 where the first variable resistance patterns 120A and the first word lines 125 are formed. The first passivation layer 130 is to prevent oxidation of the first word lines 125. The first passivation layer 130 may be formed by depositing a nitride layer to about 5 Å to 100 Å.

Thereafter, a second dielectric layer 135 is formed on the first passivation layer 130. The second dielectric layer 135 may be formed by depositing an oxide-based substance such as LP-TEOS to about 5 Å to 100 Å and filling a dielectric substance in the second trenches T2 through SOD (spin-on-dielectric). At this time, a planarization process such as chemical mechanical polishing (CMP) may be performed. According to this fact, the first hard mask pattern 110 may be partially removed.

Figure 2F:
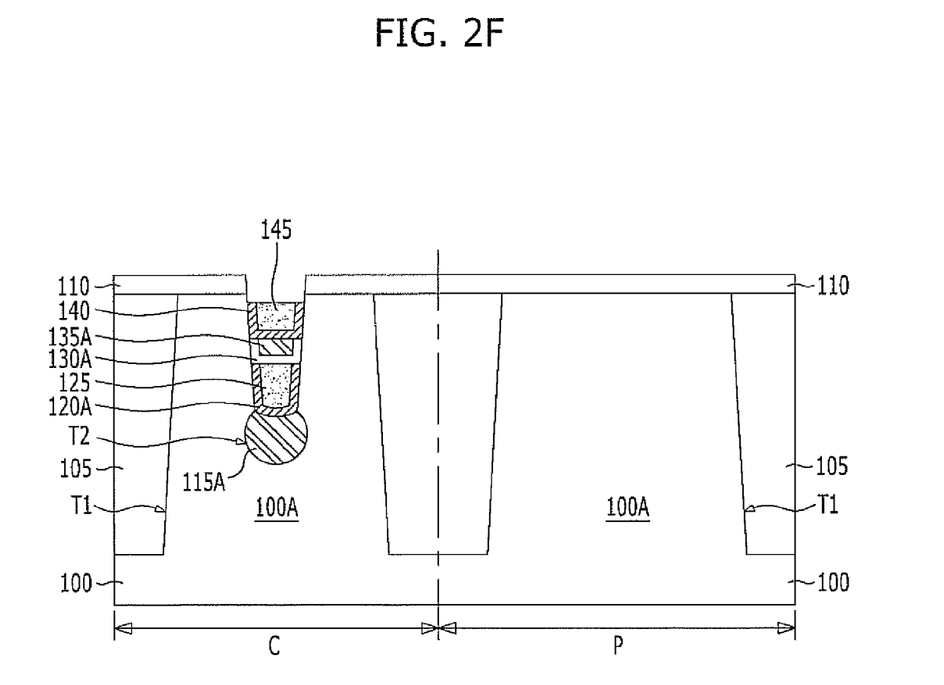

Referring to FIG. 2F, the first passivation layer 130 and the second dielectric layer 135 are partially removed through a wet and/or dry cleaning process. As a result of this process, the first passivation layer 130 and the second dielectric layer 135 remaining in the second trenches T2 will be referred to as first passivation layer patterns 130A and second dielectric layer patterns 135A, respectively. The second dielectric layer patterns 135A may have a height of about 300 Å to 1,000 Å.

Successively, a second variable resistance layer (not shown) is formed on the first hard mask pattern 110 including the second trenches T2.

The second variable resistance layer may include an oxynitride layer having a variable resistance characteristic in the same manner as the first variable resistance layer 120. For example, the second variable resistance layer may be formed by depositing a nitride layer to 3 Å to 200 Å and oxidating the nitride layer partially or wholly. An oxynitride layer with excellent properties may be uniformly formed by performing the oxidation process through radical oxidation. The characteristics of the variable resistance memory device may be changed by controlling the degree of oxidation.

However, the present invention is not limited to such, and the second variable resistance layer may include a binary oxide including a transition metal oxide (TMO) having electrical resistance changed by migration of oxygen vacancies or ions, a perovskite-based substance, or a chalcogenide-based substance having electrical resistance changed by a phase change.

Thereupon, a conductive layer (not shown) for second word lines is formed on the second variable resistance layer. The conductive layer for second word lines may be formed by depositing a barrier metal layer such as a titanium nitride (TiN), a tantalum nitride (TaN), or a tungsten nitride (WN) to about 5 Å to 100 Å and then depositing tungsten (W) to fill the second trenches T2.

Then, after a planarization process such as chemical mechanical polishing (CMP) is performed until the upper surface of the first hard mask pattern 110 is exposed, second word lines 145 are formed by additionally etching back the second variable resistance layer and the conductive layer for second word lines.

As a result of this process, the first hard mask pattern 110 may be partially removed. The remaining portions of the second variable resistance layer will be referred to as second variable resistance patterns 140. The second word lines 145 may extend in the first direction (see FIG. 1). The second word lines 145 may have a height of 300 Å to 1,000 Å in the same manner as the first word lines 125.

Figure 2G:
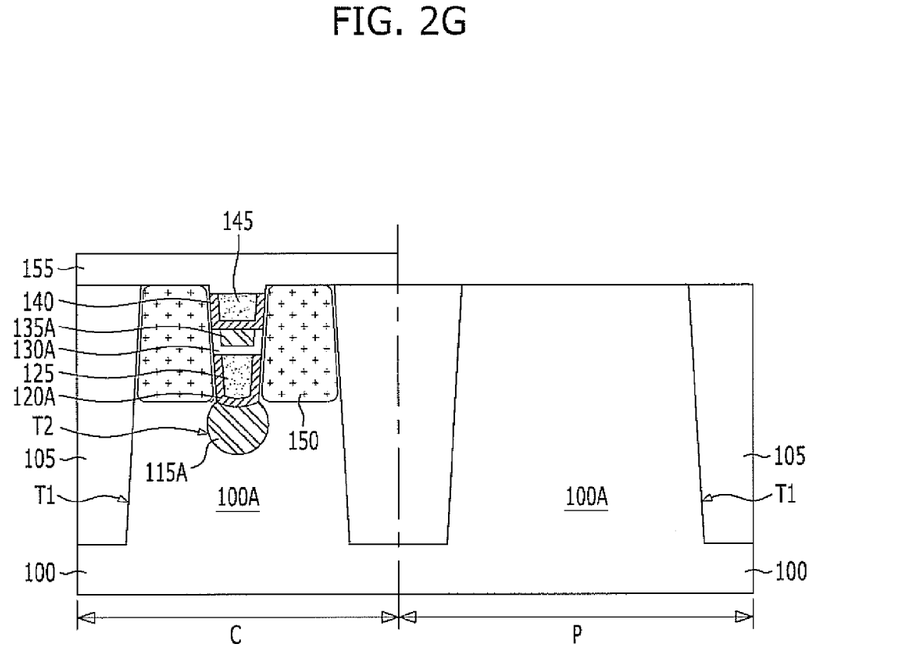

Referring to FIG. 2G, after a process of removing the first hard mask pattern 110, first junction regions 150 are formed in the active regions 100A on both sides of the second trenches T2. The first junction regions 150 may be formed by doping N-type impurities through an ion implantation process. In particular, the first junction regions 150 may be formed to a depth enough to apply a bias to the first and second variable resistance patterns 120A and 140. The first junction regions 150 may be formed to be shallower than the second trenches T2.

Next, a second passivation layer 155 is formed on the semiconductor substrate 100 of the cell region C. The second passivation layer 155 is to protect the cell region C in a subsequent process. The second passivation layer 155 may be formed by depositing a nitride layer.

Figure 2H:
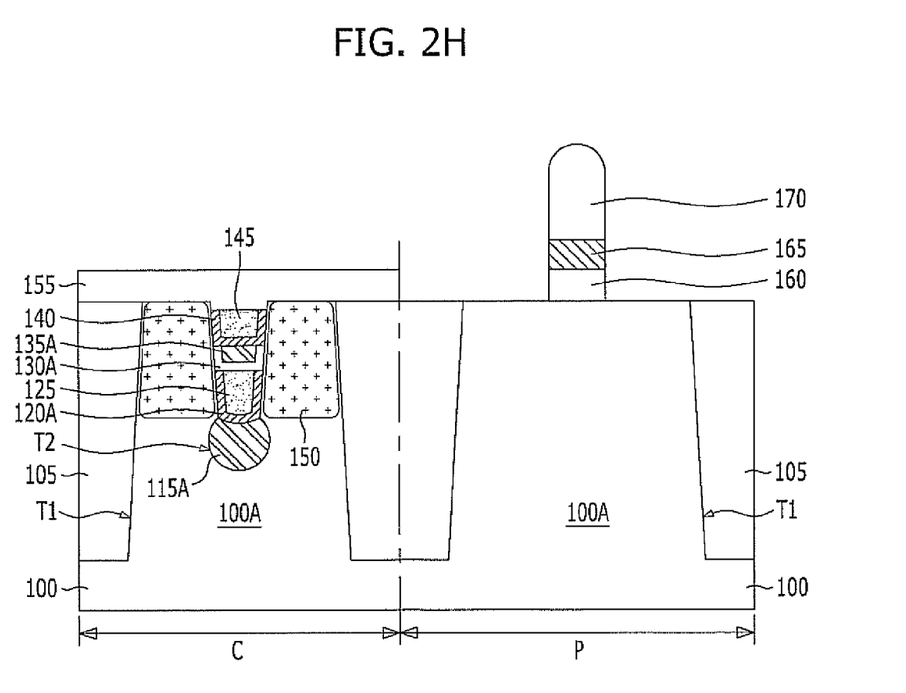

Referring to FIG. 2H, a gate dielectric layer and first and second conductive layers (not shown) are sequentially formed on the semiconductor substrate 100 of the peripheral circuit region P. The first conductive layer may be formed of a conductive substance, e.g., doped polysilicon. The second conductive layer may be formed of a barrier metal and a metal such as tungsten (W).

Then, after a process of forming a second hard mask pattern 170 which covers areas where peripheral circuit gate electrodes are formed on the second conductive layer, gate dielectric layer patterns (not shown), first conductive layer patterns 160, and second conductive layer patterns 165 are formed by etching the gate dielectric layer and the first and second conductive layers based on the second hard mask pattern 170 used as an etch mask. As a result of this process, the peripheral circuit gate electrodes constituted by the first and second conductive patterns 160 and 165 are formed.

Figure 2I:
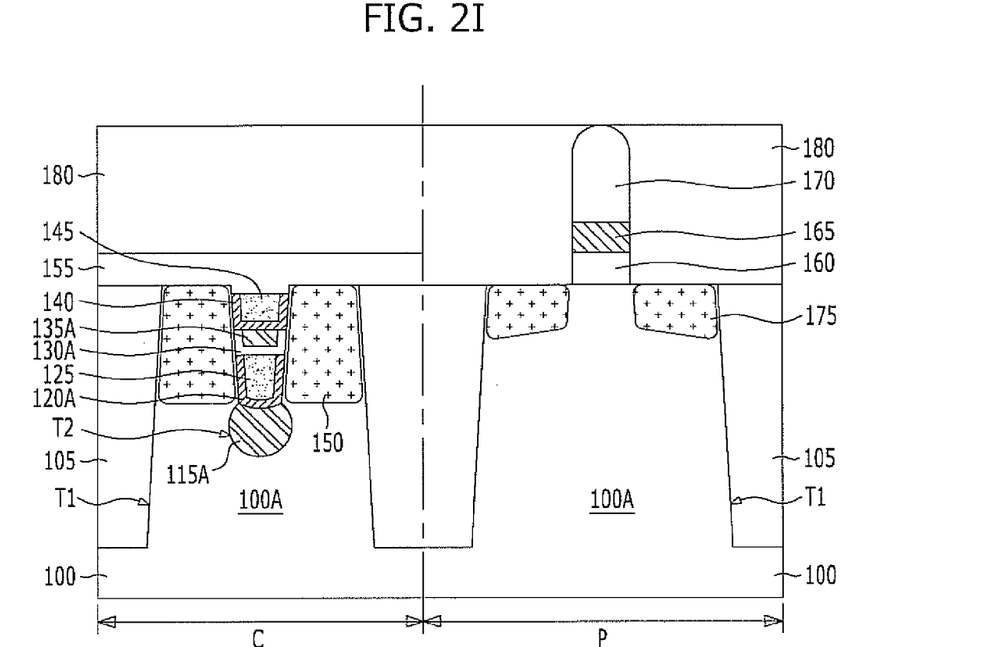

Referring to FIG. 2I, second junction regions 175 are formed in the active regions 100A on both sides of the peripheral circuit gate electrodes. The second junction regions 175 may be formed by doping N-type impurities through an ion implantation process.

After that, a first interlayer dielectric layer 180 is formed over the entire area of the semiconductor substrate 100. The first interlayer dielectric layer 180 may be formed by depositing an oxide-based substance to a substantial thickness and then performing a planarization process such as chemical mechanical polishing (CMP) until the upper surface of the second hard mask pattern 170 is exposed.

Figure 2J:
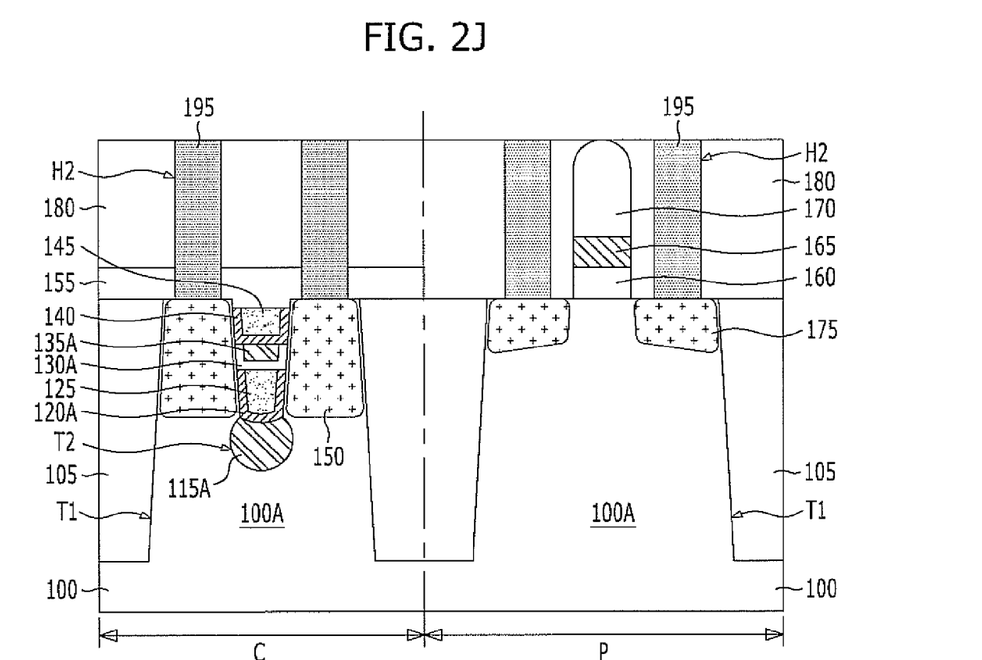
Figure 2K:
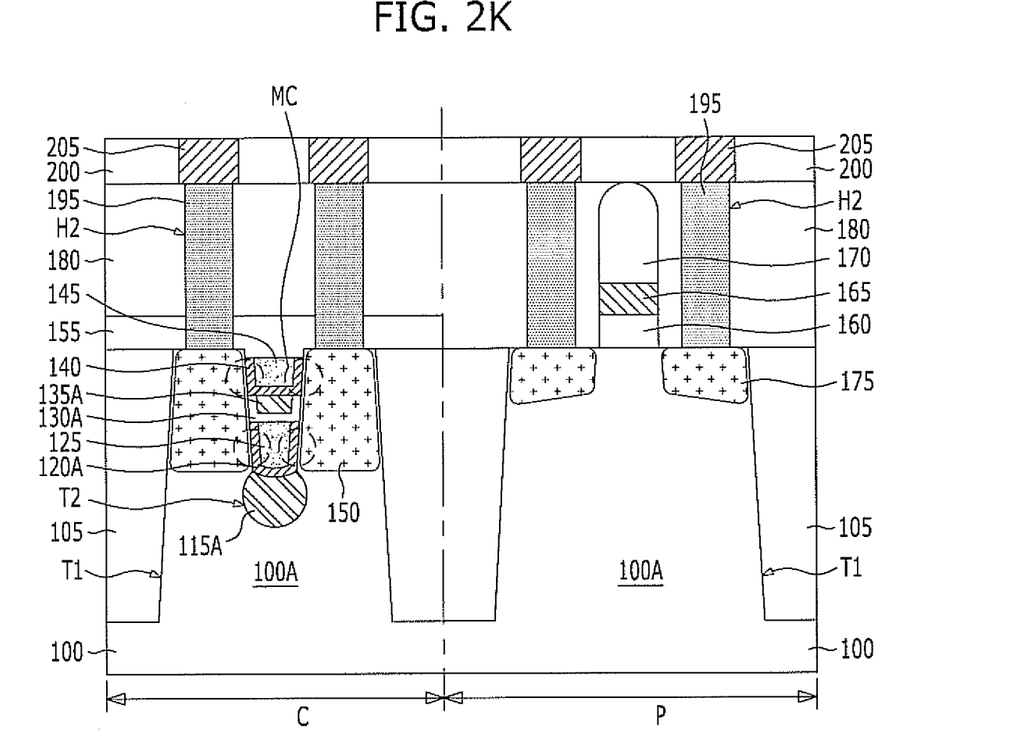

Referring to FIG. 2J, after a process of defining second contact holes H2 exposing the first and second junction regions 150 and 175 by selectively etching the first interlayer dielectric layer 180 and the second passivation layer 155, second contact plugs 195 are formed in the second contact holes H2.

The second contact plugs 195 may be formed by depositing a conductive substance such as a doped polysilicon, a metal, or a metal nitride to fill the second contact holes H2 and then performing a planarization process such as chemical mechanical polishing (CMP) until the upper surface of the first interlayer dielectric layer 180 is exposed.

Referring to FIG. 2K, a second interlayer dielectric layer 200 is formed on the resultant structure formed with the second contact plugs 195. The second interlayer dielectric layer 200 may be formed by depositing an oxide-based or nitride-based substance.

Next, bit lines 205, which are connected with the second contact plugs 195 and extend in a direction crossing with the first and second word lines 125 and 145, i.e., a second direction (see FIG. 1), are formed. The bit lines 205 may be formed by providing spaces for forming the bit lines 205 through selectively etching the second interlayer dielectric layer 200 and then filling a conductive substance such as doped polysilicon, a metal, or a metal nitride in the spaces.

Figure 3A:
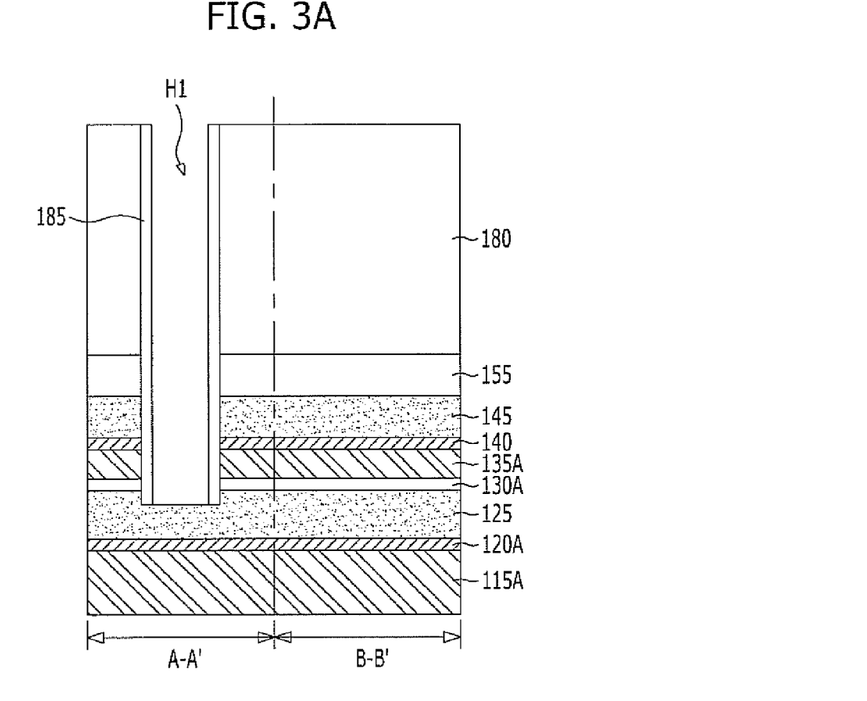
FIGS. 3A to 3C are cross-sectional views explaining a contact plug forming method in the variable resistance memory device in accordance with the embodiment of the present invention.
Figure 3B:
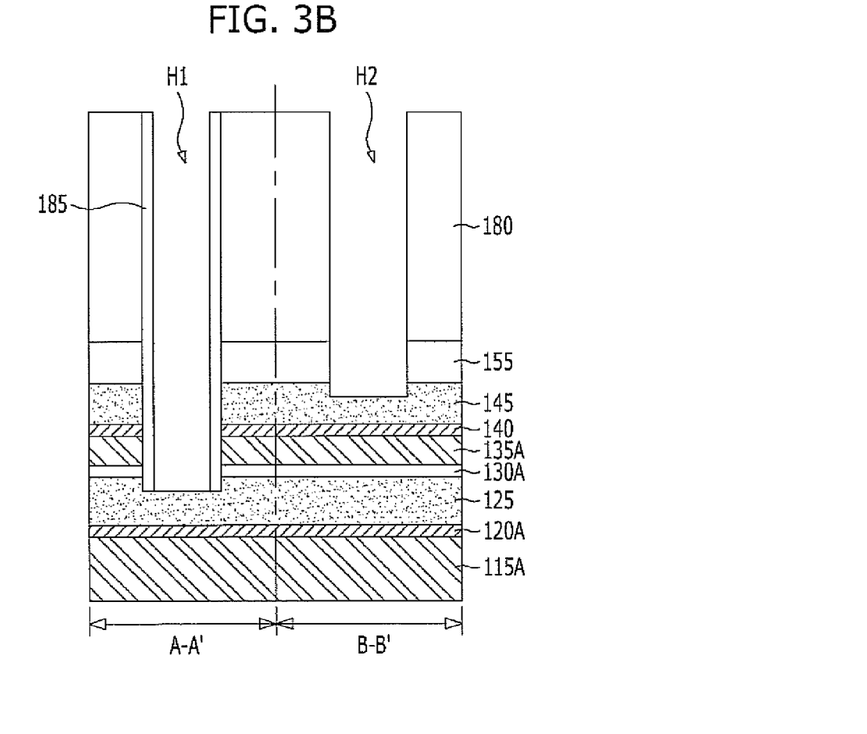
Figure 3C:
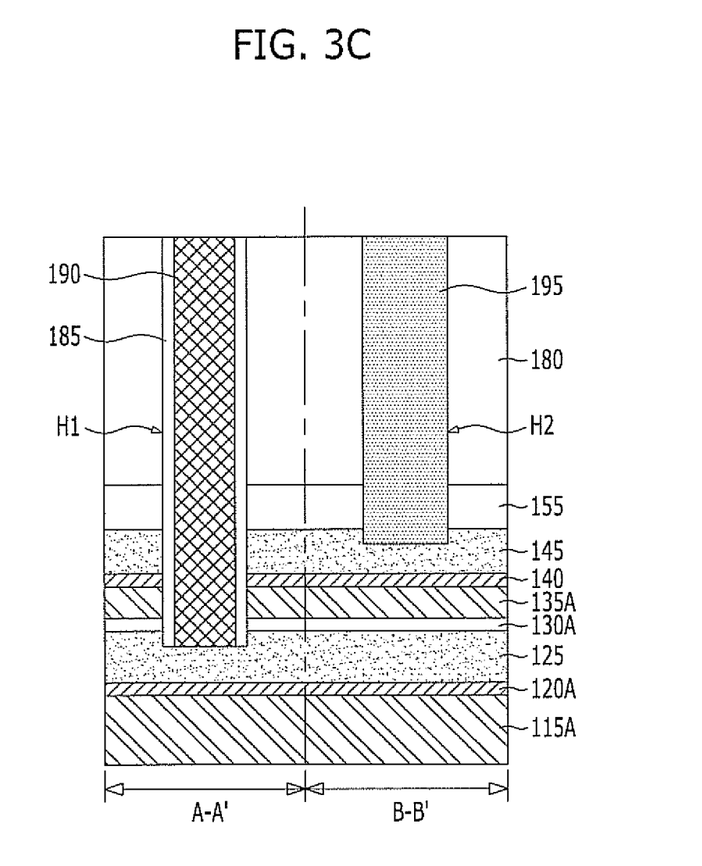

FIGS. 3A to 3C are cross-sectional views explaining a contact plug forming method in the variable resistance memory device in accordance with the embodiment of the present invention. Each of FIGS. 3A to 3C shows cross-sections respectively taken along the line A-A' and B-B' of FIG. 1.

Referring to FIG. 3A, first contact holes H1 are defined to expose portions of the first word lines 125 by selectively etching the first interlayer dielectric layer 180, the second passivation layer 155, the second word lines 145, the second variable resistance patterns 140, the second dielectric layer patterns 135A, and the first passivation layer patterns 130A.

Then, a spacer layer 185 is formed on the sidewalls of the first contact holes H1. The spacer layer 185 is to prevent the second word lines 145 and first contact plugs from being connected with each other. The spacer layer 185 may be formed by depositing a nitride layer to about 10 Å to 200 Å.

Referring to FIG. 3B, by selectively etching the first interlayer dielectric layer 180 and the second passivation layer 155, the second contact holes H2 are defined to expose portions of the second word lines 145. The second contact holes H2 may be defined on the first and second junction regions 150 and 175 (see FIG. 2J).

Referring to FIG. 3C, first contact plugs 190 filling the first contact holes H1 and the second contact plugs 195 filling the second contact holes H2 are formed.

The first and second contact plugs 190 and 195 may be formed by depositing a conductive substance such as doped polysilicon, a metal, or a metal nitride to fill the first and second contact holes H1 and H2 and performing a planarization process such as chemical mechanical polishing (CMP) until the upper surface of the first interlayer dielectric layer 180 is exposed.

In particular, a processing margin may be sufficiently secured by arranging the first contact plugs 190 connected with the first word lines 125 and the second contact plugs 195 connected with the second word lines 145 in a zigzag manner, i.e., to be alternately disposed in the second direction (see FIG. 1). Peripheral circuits may be efficiently formed in a view of integration degree.

By the fabrication method as described above, the variable resistance memory device in accordance with the embodiment of the present invention as shown in FIGS. 1 and 2K may be fabricated.

Referring to FIGS. 1 and 2K, the variable resistance memory device in accordance with the embodiment of the present invention may include the semiconductor substrate 100 which has the active regions 100A defined by the isolation layer 105, the second trenches T2 which extend in the first direction in the semiconductor substrate 100 while crossing the active regions 100A, the first and second dielectric layer patterns 115A and 135A and the first and second word lines 125 and 145 which are alternately stacked in the second trenches T2, first junction regions 150 which are formed in the active regions 100A on both sides of the second trenches T2, first and second variable resistance patterns 120A and 140 which are interposed between the first and second word lines 125 and 145 and the first junction regions 150, the first contact plugs 190 which are connected with the first word lines 125, the spacer layer 185 which is interposed between the first contact plugs 189 and the second word lines 145, the second contact plugs 195 which are connected with the first and second junction regions 150 and 175 and the second word lines 145, and the bit lines 205 which are connected with the second contact plugs 195 and extend in the second direction.

The second trenches T2 may have a bulb-like shape capable of minimizing an interference phenomenon between the first junction regions 150. The spherical portions formed at the lower ends of the second trenches T2 may be filled with the first dielectric layer patterns 115A. While word lines are stacked by two layers in the embodiment, the present invention is not limited to such. Word lines may be formed to a single layer or may be stacked by at least three layers through defining the second trenches T2 deeper.

The first and second variable resistance patterns 120A and 140 may include a substance of which electrical resistance changes by migration of vacancies or ions or phase change. The first and second variable resistance patterns 120A and 140 may include at least any one selected from the group consisting of an oxynitride layer having resistance changed between two different resistance states according to an applied voltage or current, a binary oxide including a transition metal oxide (TMO), a perovskite-based substance, and a chalcogenide-based substance. Also, the first and second variable resistance patterns 120A and 140 may cover the sides and the bottoms of the first and second word lines 125 and 145.

The first junction regions 150 may be formed shallower than the depth of the second trenches T2. The first and second contact plugs 190 and 195 may be alternately arranged in the direction (the second direction) crossing with the first and second word lines 125 and 145.

Memory cells MC operate by the first and second word lines 125 and 145, the first junction regions 150 and the first and second variable resistance patterns 120A and 140 interposed therebetween. Four memory cells MC are formed in each active region 100A of the cell region C. As four memory cells MC are formed in the area of $4F \times 3F = 12F^2$ (F is a critical dimension) so that each memory cell MC occupies the area of $3F^2$, the degree of integration of the memory cells MC may be improved.

As is apparent from the above descriptions, in the variable resistance memory device and the method for fabricating the same according to the embodiment of the present invention, word lines and so forth are formed through deposition and etch-back processes with high technical maturity. Processes for a cell region and a peripheral region may be simultaneously performed. Because the number of mask processes may be decreased, entire processes may be made easier and simpler. Also, as word lines are formed in multiple layers, the integration degree of memory cells may be significantly improved.

While the present invention has been described with respect to the specific embodiments, it will be apparent to those skilled in the art that various changes and modifications may be made without departing from the spirit and scope of the invention as defined in the following claims.

What is claimed is:

1. A variable resistance memory device, comprising:
    active regions defined by an isolation layer in a semiconductor substrate;
    trenches in the semiconductor substrate, which extend in a direction crossing the active regions;
    dielectric layers and word lines stacked in the trenches;
    junction regions formed in the active regions over both sides of the trenches; and
    variable resistance patterns interposed between the word lines and the junction regions,
    wherein the word lines are stacked in a plurality of layers in a direction perpendicular to an upper surface of the semiconductor substrate, and
    wherein the dielectric layers are interposed between the word lines.

2. The variable resistance memory device of claim 1, wherein the variable resistance patterns cover sides and bottoms of the word lines.

3. The variable resistance memory device of claim 1, wherein the variable resistance patterns include a substance of which electrical resistance changes by migration of vacancies or ions or by a phase change.

4. The variable resistance memory device of claim 3, wherein the variable resistance patterns include at least any selected from the group consisting of an oxynitride layer, a transition metal oxide, a perovskite-based substance and a chalcogenide-based substance.

5. The variable resistance memory device of claim 1, wherein the trenches have a bulb-like shape.

6. The variable resistance memory device of claim 5, wherein spherical portions of the trenches with the bulb-like shape are filled with the dielectric layers.

7. The variable resistance memory device of claim 1, wherein the junction regions are formed shallower than a depth of the trenches.

8. The variable resistance memory device of claim 1, further comprising:
    contact plugs connected with the junction regions; and bit lines connected with the contact plugs and extending in a direction crossing with the word lines.

9. The variable resistance memory device of claim 1, wherein the word lines include first word lines and second word lines which are formed over the first word lines with the dielectric layers interposed therebetween, and wherein the variable resistance memory device further comprises:

first contact plugs connected with the first word lines;

a spacer layer interposed between the first contact plugs and the second word lines; and second contact plugs connected with the second word lines.

10. The variable resistance memory device of claim 9, wherein the first and second contact plugs are alternately arranged in a direction crossing with the first and second word lines.

11. A non-volatile memory device, comprising:

an isolation layer to define an active region; and plural stacked word lines, each attached with a variable resistance layer to store data, a dielectric layer interposed between the plural stacked word lines, wherein the dielectric layer and the plural stacked word lines are located within a trench in a substrate, and the plural stacked word lines cross the active region, wherein the plural stacked word lines are stacked in a direction perpendicular to an upper surface of the substrate.

* * * * *